United States Patent [19]

Ema et al.

[11] Patent Number: 5,138,575
[45] Date of Patent: Aug. 11, 1992

[54] ELECTRICALY ERASABLE AND PROGRAMMABLE READ ONLY MEMORY WITH A DISCHARGE DEVICE

[75] Inventors: Taiji Ema, Kawasaki; Masahiro Nakahara, Miyazaki, both of Japan

[73] Assignees: Fujitsu Limited, Kanagawa; Kyushu Fujitsu Electronics Limited, Kagoshima, both of Japan

[21] Appl. No.: 448,470

[22] Filed: Dec. 11, 1989

[30] Foreign Application Priority Data

Dec. 19, 1988 [JP] Japan ............................. 63-319798
Dec. 19, 1988 [JP] Japan ............................. 63-319799

[51] Int. Cl.$^5$ ........................ G11C 16/04; G11C 7/00
[52] U.S. Cl. ........................... 365/185; 365/189.09; 365/204; 365/233; 365/233.5
[58] Field of Search ............ 365/226, 189.09, 230.06, 365/233.5, 210, 185, 238.5, 203, 204; 357/23.5

[56] References Cited

U.S. PATENT DOCUMENTS

| | | | |
|---|---|---|---|
| 4,279,024 | 7/1981 | Schrenk | 365/203 |
| 4,677,590 | 6/1987 | Arakawa | 365/185 |
| 4,719,603 | 1/1988 | Shinagawa et al. | 365/230.06 |
| 4,727,519 | 2/1988 | Morton et al. | 365/233 |
| 4,807,003 | 2/1989 | Mohammadi et al. | 357/23.5 |
| 4,835,742 | 5/1989 | Schrenk | 365/238.5 |
| 4,905,197 | 2/1990 | Urai | 365/204 |

FOREIGN PATENT DOCUMENTS

| | | |
|---|---|---|
| 0154379 | 9/1987 | European Pat. Off. . |
| 0280883 | 2/1989 | European Pat. Off. . |
| 3741937 | 6/1988 | Fed. Rep. of Germany . |
| 2626401 | 7/1989 | France . |
| 0137591 | 10/1981 | Japan ............................. 365/204 |

*Primary Examiner*—Joseph A. Popek
*Assistant Examiner*—Jack A. Lane
*Attorney, Agent, or Firm*—Nikaido, Marmelstein, Murray & Oram

[57] ABSTRACT

An electrically erasable and programmable read only memory includes a memory cell array having a plurality of memory cells coupled to bit lines and word lines. Each of the memory cells includes a select transistor controlled by one of the word lines, a memory transistor of the enhancement type coupled to one of the bit lines through the select transistor and having a control gate, and a drive transistor having a gate coupled to the one of the word lines and applying a control gate voltage supplied through a program line to the control gate of the memory transistor. Further, the electrically erasable and programmable read only memory includes a select device for selecting at least one of the bit lines and one of the word lines on the basis of an address supplied from an external device, and a sense amplifier for outputting data stored in the memory cell array. Also provided is a discharging device which discharges the drain regions and the control gates of the memory transistors after a predetermined time has passed from a transition of the address and application of the control gate voltage.

14 Claims, 9 Drawing Sheets

ELECTRICALY ERASABLE AND PROGRAMMABLE READ ONLY MEMORY WITH A DISCHARGE DEVICE

BACKGROUND OF THE INVENTION

The present invention generally relates to a semiconductor memory and, more particularly, to an electrically erasable and programmable read only memory (EEPROM) having an insulating film through which a charge is transferred so that the content of a memory cell is electrically rewritten.

Recently, two different types of EEPROM have been proposed, one of which has a configuration which utilizes a trap formed at an interface between insulating films of different types, and the other type has a configuration which utilizes a floating gate. The two types of EEPROM utilize the tunnel effect in data write and erase. Thus, current generated at the time of data write or erase is extremely small. As a result of small current, a variety of EEPROMs have been developed. For example, an EEPROM has a mode in which data relating to all bits can be erased at the same time, or alternatively has a mode in which data can be written or erased per page unit. Generally, an erasable and programmable ROM (EPROM) is mounted on a printed circuit board after writing data therein. On the other hand, an EEPROM is subjected to data rewrite in a state where it is mounted on a printed circuit board. For this reason, an endurance (the possible number of times that data is repeatedly rewritten) is an important factor.

A conventional EEPROM is illustrated in FIGS. 1A, 1B, 1C and 2. Referring to FIG. 1A, there is illustrated a structure of a memory transistor of EEPROM. The illustrated EEPROM 1 includes a semiconductor substrate 2, in which a source region 3 and a drain region 4 are formed. A control gate 5 is formed of polysilicon and is electrically insulated from the substrate 2. A floating gate 6 is formed between the control gate 5 and the drain region 4. A thin oxidation film (tunnel oxidation film) 7 having a thickness of about 100 angstroms is formed between the drain region 4 and the floating gate 6.

Referring to FIG. 2, memory transistors 11-14 each have the transistor structure shown in FIG. 1A. The memory transistors 11 and 13 are connected to a bit line BL1, and the memory transistors 12 and 14 are connected to a bit line BLn. Select transistors 15-20 select the memory transistors 11-14, respectively. Drive transistors 21-23 apply a predetermined voltage to the gates (control gates) of the corresponding memory transistors to thereby drive them. The drive transistor 21 drives the control gates of the memory transistors 11 and 12, and the drive transistor 22 drives the control gates of the memory transistors 13 and 14. It is noted that the drive transistors 21-23 are formed of the depletion type in order to suppress a voltage drop occurring at the time of data write. As indicated by a block of a broken line having a reference numeral $1_1$, $1_n$, $2_1$ or $2_n$ (n is an integer), one memory transistor and one select transistor configure one bit. A one-dotted chain line which includes the one-bit blocks $1_1$-$1_n$ correspond to one byte. WL1 - WLn indicate word lines, BL1 - BLn indicate bit lines, and PL indicates a program line for controlling the control gates of the memory transistors 11-14. $V_{CG}$ is a voltage of the program line PL. $V_{SS}$ is a low-potential side power source or indicates the voltage thereof (ground (GND) for example).

One byte indicated by the one-dotted chain line is selected as follows. The word line WL1 is turned ON, and the bit lines BL1-BLn are set to a predetermined potential. In response to this change of the word line WL1, the select transistors 15 and 16 and the drive transistor 21 are turned ON, and a voltage is applied to the drains of the select transistors 15 and 16. When the predetermined voltage $V_{CG}$ is applied to the program line PL, this voltage is applied to the control gates of the memory transistors 11 and 12. At this time, the drive transistor 21 is ON because the word line WL1 is ON. Data read is executed by making a decision on whether currents pass through the memory transistors 11 and 12.

However, the aforementioned EEPROM has disadvantages arising from an arrangement that the voltage $V_{CG}$ is applied to not only the selected memory transistors but also non-selected memory transistors when data is read out. The disadvantages caused by the above-mentioned arrangement will be described in detail below.

As described previously, the drive transistors 21-23 for driving the control gates of the memory transistors 11-14 are of the depletion type (normally ON). Thus, when it is requested to read out data from the memory transistors 11 and 12 and the voltage $V_{CG}$ (2-4 volts for example) is applied to the program line PL, not only the drive transistor 21 relating to the selected memory transistors 11 and 12 but also the drive transistors 22 and 23 relating to the non-selected memory transistors are turned ON. As a result, the voltage $V_{CG}$ is applied to the control gates of the non-selected memory transistors 13 and 14. If data stored in the memory transistor 13 causes it to maintain ON, a voltage of 0 volt is applied to the source and drains thereof when $V_{SS}=0$ volt. At this time, voltages shown in FIG. 1B are applied to the control gate 5 and the drain region 4 of the memory transistor 13 although it is not selected. Even in a standby state, a voltage is applied to the control gates of all the memory transistors as shown in FIG. 1B.

The state of the memory transistor 11 observed at this time is schematically illustrated in FIG. 1C. In FIG. 1C, C1 is a coupling capacitance between the control gate 5 and the floating gate 6, C2 is a coupling capacitance between the floating gate 6 and the drain region 4, and Q is an accumulated charge. A voltage V applied to the thin oxidation film is calculated as follows. First, following formula (1) is obtained due to the fact that the accumulated charges must be conserved:

$$C1 \times (V_{CG} - V) + Q = C2 \times (V - V_D) \qquad (1)$$

where $V_{CG}$ is the voltage of the control gate, and $V_D$ is the drain voltage. From formula (1), the voltage $(V - V_D)$ applied to the thin oxidation film 7 is represented as follows:

$$V = (C1 V_{CG} + C2 V_D + Q)/(C1 + C2)$$

$$V - V_D = [Q + C1(V_{CG} - V_D)]/(C1 + C2) \qquad (2)$$

It can be seen from formula (2) that the larger the potential difference $|V_{CG} - V_D|$, the larger the voltage V applied to the thin oxidation film 7. When the storage data of a non-selected memory transistor causes it to maintain ON, the charge Q is a positive charge. When the voltage $V_{CG}$ equal to 3 volts and the voltage $V_D$ equal to 0 volt are being applied to the non-selected memory transistor, a considerably high voltage is applied to the thin oxidation film 7 thereof. In this state, the positive charge Q is liable to pour into the drain region 4 through the thin oxidation film 7. This effect functions to decrease the data holding time of the non-selected memory transistor.

FIG. 3 is a graph illustrating the relationship between a variation ΔVth of the threshold voltage Vth of a memory transistor and the bias applying time. It can be seen from the graph of FIG. 3 that the larger the voltage difference $|V_{CG}-V_D|$, the larger a variation ΔVth where ΔV$_{th}$ is the difference between a threshold voltage in the initial state and a threshold voltage in the data erase or write state as shown in FIG. 5.

FIG. 4 is a graph illustrating the relationship between the data holding time (log. scale) and the voltage difference $|V_{CG}-V_D|$. It can be seen from the graph of FIG. 4 that the data holding time decreases with an increase of the voltage difference $|V_{CG}-V_D|$. It can be seen from the above discussion that a reduction of the variation ΔVth with respect to the data readout time contributes to an improvement of the data holding time.

FIG. 6 is a graph illustrating the relationship between the data holding time and the number of times that data is repeatedly rewritten. It can be seen from the graph of FIG. 6 that the data holding time decreases with an increase of the number of times that data is repeatedly rewritten.

As described above, since the voltage difference $|V_{CG}-V_D|$ is large in the non-selected memory transistor at the time of data read and in the standby state, it is difficult to improve the data holding time and provide an increased number of times that data can be erased or written.

SUMMARY OF THE INVENTION

It is a general object of the present invention to provide an improved EEPROM in which the aforementioned disadvantages are eliminated.

A more specific object of the present invention is to provide an EEPROM having an improved data holding time and an increased number of times that data can repeatedly rewritten.

The above objects of the present invention are achieved by an electrically erasable and programmable read only memory comprising a memory cell array including a plurality of memory cells coupled to bit lines and word lines. Each of the memory cells includes a select transistor controlled by one of the word lines, a memory transistor coupled to one of the bit lines through the select transistor and having a control gate, and a drive transistor of the enhancement type having a gate coupled to the one of the word lines and applying a control gate voltage supplied through a program line to the control gate of the memory transistor. The memory further comprises a select device for selecting at least one of the bit lines and one of the word lines on the basis of an address supplied from an external device; and sense amplifier device for outputting data stored in the memory cell array. When the select device selects one of the word lines at the time of reading out data stored in the memory cells coupled to the selected word line, the drive transistor relating to the selected word line is turned ON due to a level change of the selected word line so that the control gate voltage is applied to the control gates of the memory transistors through the turned-ON drive transistor and thereby drives the corresponding memory transistors, and the other memory transistors relating to the remaining non-selected word lines are provided with no control gate voltage through the corresponding drive transistors held OFF.

The above-mentioned objects of the present invention are also achieved by an electrically erasable and programmable read only memory comprising a memory cell array having a plurality of electrically erasable and programmable non-volatile memory cells each having a transistor having a drain, a source, a control gate and a floating gate; and a selection device for selecting one of the non-volatile memory cells in accordance with an address signal to thereby read out information stored in the selected one of the non-volatile memory cells and for supplying the control gate and drain of the transistor of the selected one of the memory cells with a substantially equal voltage when reading out the information stored therein.

Further objects, features and advantages of the present invention will become apparent from the following detailed description when read in conjunction with the accompanying drawings.

DESCRIPTION OF THE PREFERRED EMBODIMENTS

Figure 7:
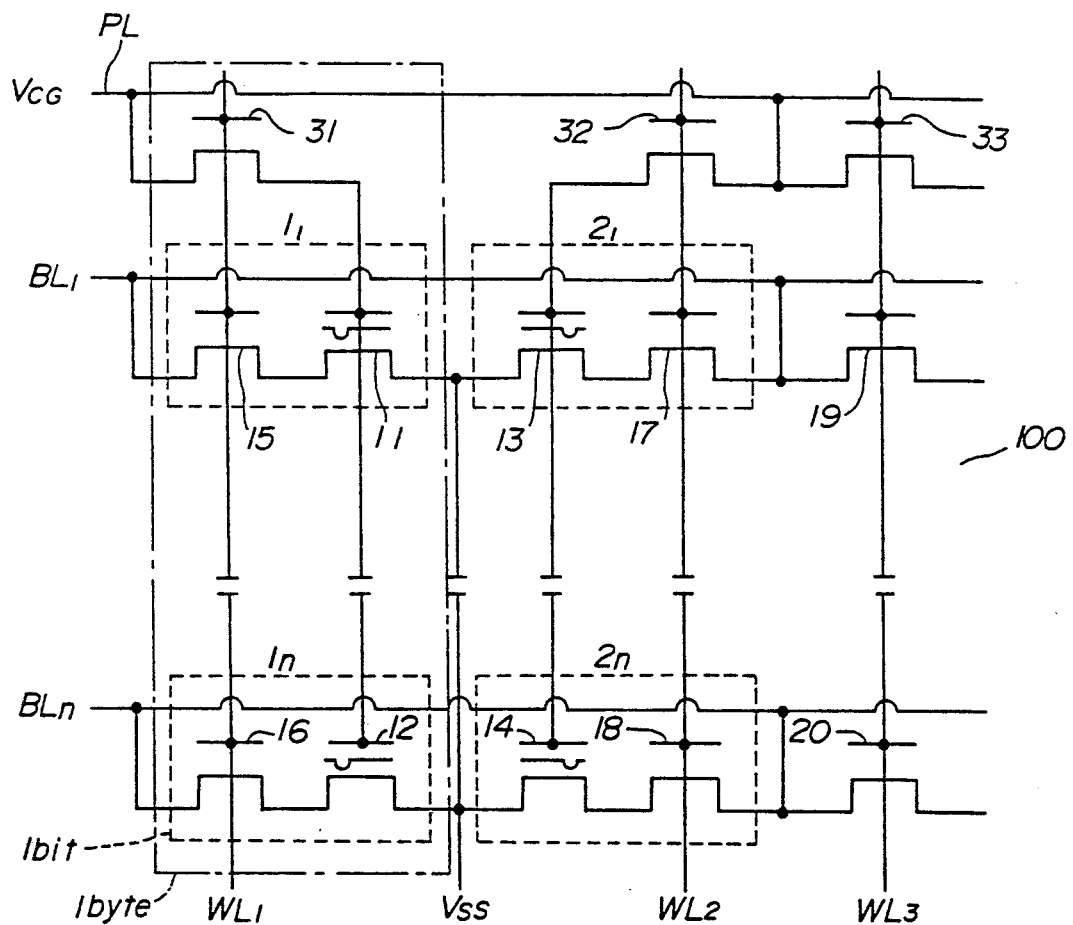
FIG. 7 is a circuit diagram of a preferred embodiment of the present invention.
Figure 8:
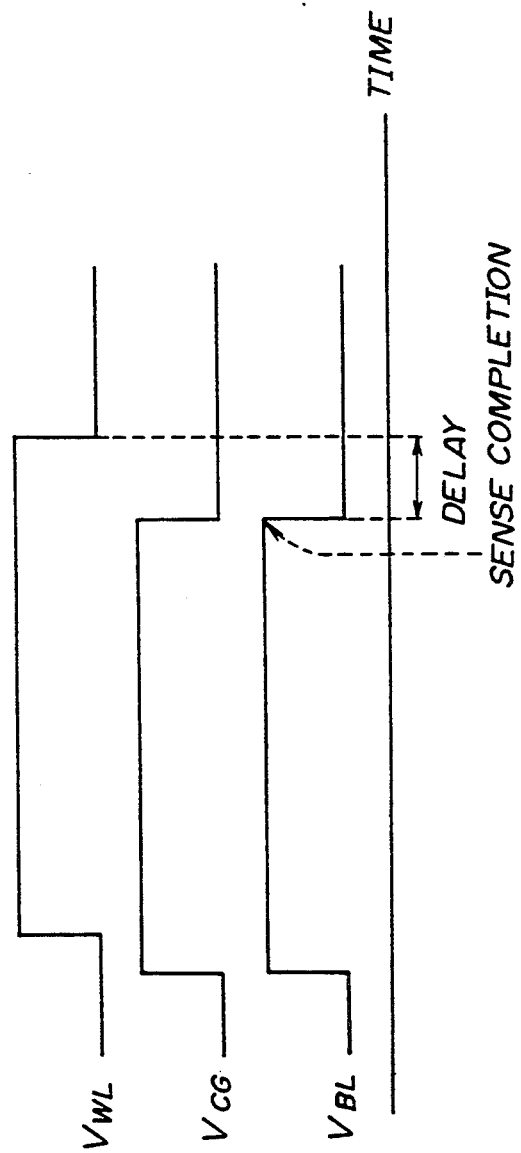
FIG. 8 is a waveform diagram of signals at different parts of the circuit shown in FIG. 7 when reading out data.

A description is given of a preferred embodiment of the present invention with reference to FIGS. 7 and 8. In FIG. 7, those parts which are the same as those in the previous figures are given the same reference numerals.

Figure 1:
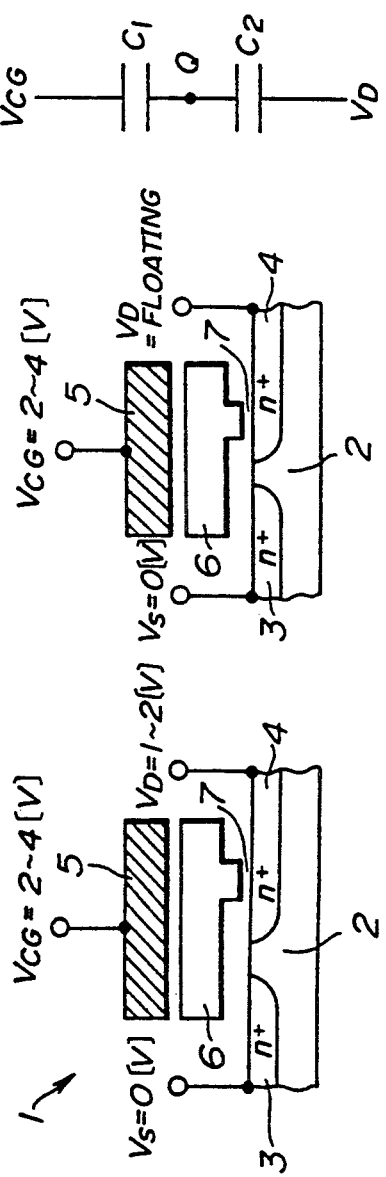
FIGS. 1A, 1B and 1C are diagrams illustrating a conventional EEPROM and disadvantages thereof.
Figure 2:
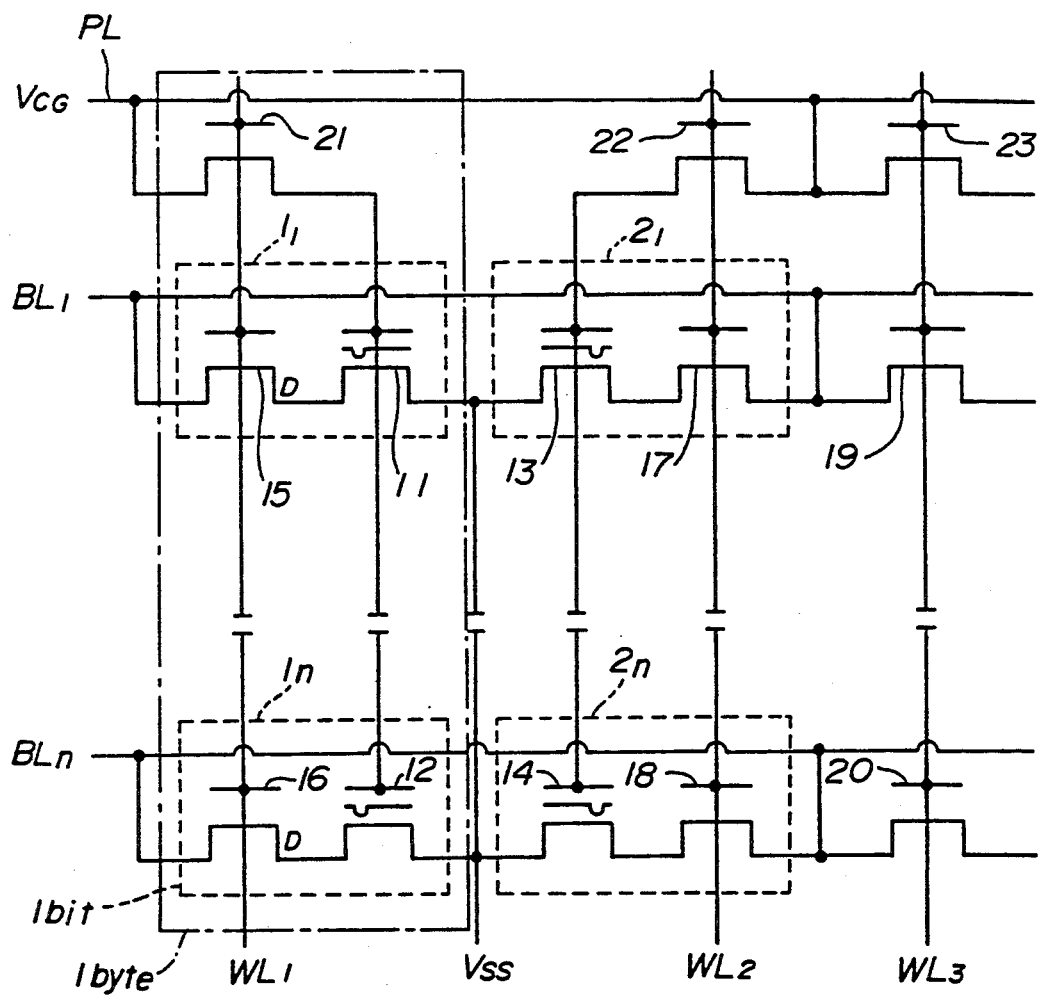
FIG. 2 is a circuit diagram of a conventional EEPROM.
Figure 3:
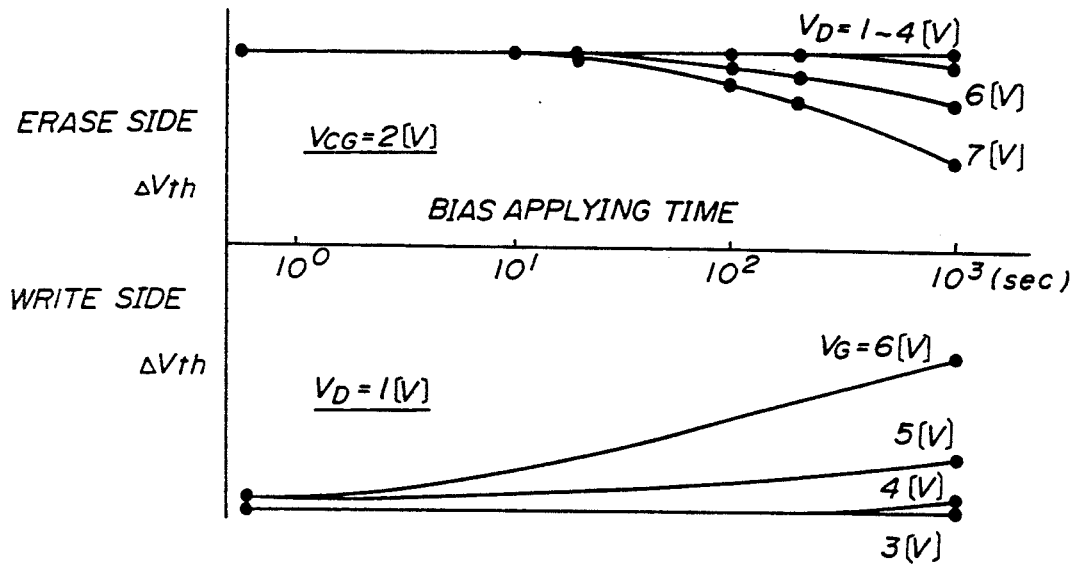
FIG. 3 a graph illustrating the relationship between a variation ΔVth of the threshold voltage Vth of a memory transistor and the bias applying time.

Referring to FIG. 7, there is illustrated a part of a memory cell array 100. Driving transistors 31, 32 and 33, which are substituted for the driving transistors 11, 12, and 13 shown in FIG. 2, drive the control gates of the corresponding memory transistors 11-14. It is noted that the driving transistors 31, 32 and 33 are formed by enhancement type transistors (normally OFF). The use of enhancement transistors is intended not to apply a voltage to the control gates of non-selected memory transistors. It is noted that a simple replacement of the depletion type driving transistors 11, 12, and 13 with the enhancement type driving transistors 31, 32 and 33 causes some problems as will be described later. Thus, according to the embodiment, some improvements in data readout timing are provided.

Data readout is executed for every byte. For example, the word line WL1 is set ON and the word lines WL2 and WL3 are set OFF. Further, the voltage $V_D$ is applied to the bit lines BL1-BLn equal to one byte. The sources are set to the floating state or zero volt, and the voltage $V_{CG}$ is set to $V_G$. In this state, voltages are applied only to the control gates and drains of the selected memory transistors equal to one byte and, on the other hand, the control gates and drains of the non-selected memory transistors are set to the floating state. Voltage values in this condition is listed in the following table.

TABLE

| State | | Bias Condition | |
|---|---|---|---|
| | | $V_{CG}$ | $V_D$ |
| Data readout | Selected cell | 2-4[V] | 1-2[V] |
| | Non-selected | 0 | 0 |
| Standby | All cells | 0 | 0 |

It is noted that if the word line WL1 being ON is turned OFF at the same time as data readout is completed, charges are shut in the control gates and/or drains of the memory transistors 11-14. Thus, a voltage is being applied to the drains and/or control gates even after the completion of data readout. Similarly, if the bit lines BL1 - BLn being ON are turned OFF at the same time as data readout is completed, charges are shut in the control gates of the memory transistors 11-14. Thus, it is necessary to turn OFF the word line WL1 after setting the voltage $V_{CG}$ applied to the control gates and the voltage $V_{BL}$ of the bit lines BL1-BLn to zero volt.

That is, as shown in FIG. 8, the control gate voltage $V_{CG}$ is decreased to zero volts and the voltage $V_{BL}$ of the bit lines BL1-BLn is decreased to zero volts, and thereafter the word line WL1 is turned OFF, or in other words, the voltage $V_{WL1}$ of the word line WL1 is set to zero volt (discharged). As will be describe later, when a sense amplifying operation is completed, the control gate voltage $V_{CG}$ and the bit line voltage $V_{BL}$ are set to zero volts, and thereafter the word line voltage $V_{WL1}$ is set to zero volts with a predetermined delay of time equal to 1 ns, for example. With such dynamic a readout timing, it becomes possible to discharge the charges accumulated in the control gates of the memory transistors so that no voltages are applied to the memory transistors during a time other than data readout time. In the standby mode, all the word lines WL are OFF, and no voltages are applied to the drains and control gates.

Figure 4:
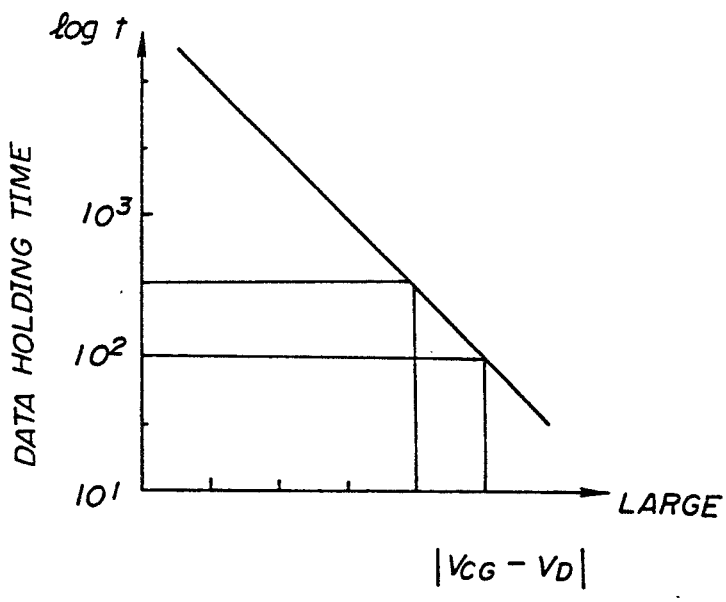
FIG. 4 is a graph illustrating the relationship between the data holding time and a voltage difference $|V_{CG}-V_D|$.
Figure 5:
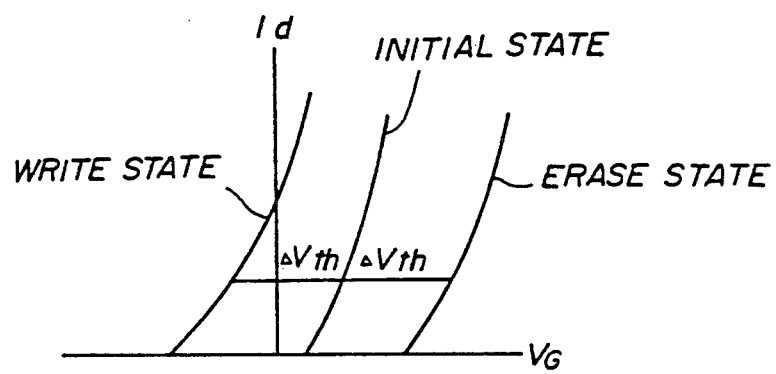
FIG. 5 is a graph illustrating a variation ΔVth of the threshold voltage when the memory transistor is switched to the write state or the erase state from the initial state.
Figure 6:
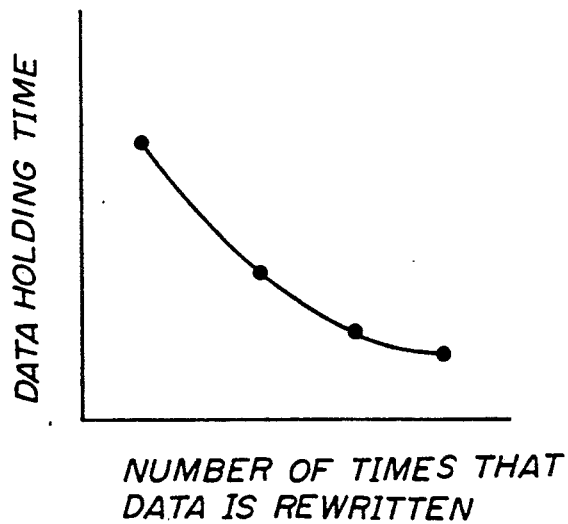
FIG. 6 is a graph illustrating the relationship between the data holding time and the number of times that data is repeatedly rewritten.

It is preferable that the control gate voltage $V_{CG}$ be equal to the bit line voltage $V_{BL}$. For example, ($V_{CG}$, $V_{BL}$)=(1V, 1V), (2V, 2V), (3V, 3V) or the like. Advantages presented by this setting of $V_{CG}$ and $V_{BL}$ can be seen from the graph of FIG. 4.

Figure 9:
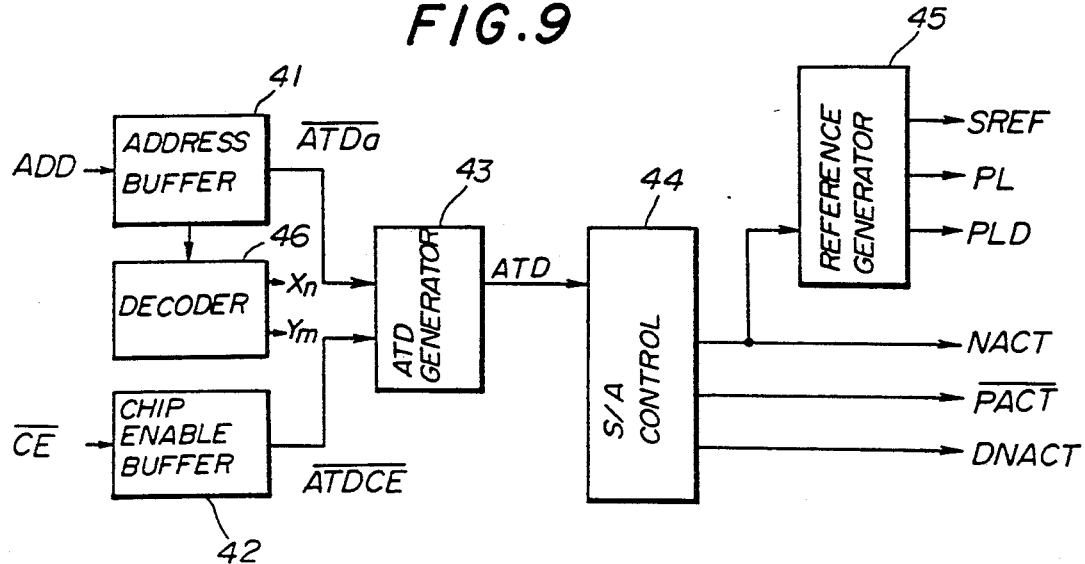
FIG. 9 is a block diagram of a peripheral circuit of a memory cell array according to the embodiment of the present invention.

A description is given of a peripheral circuit the memory cell array 100. Referring to FIG. 9, there is illustrated a peripheral circuit of the memory cell array.

Figure 10:
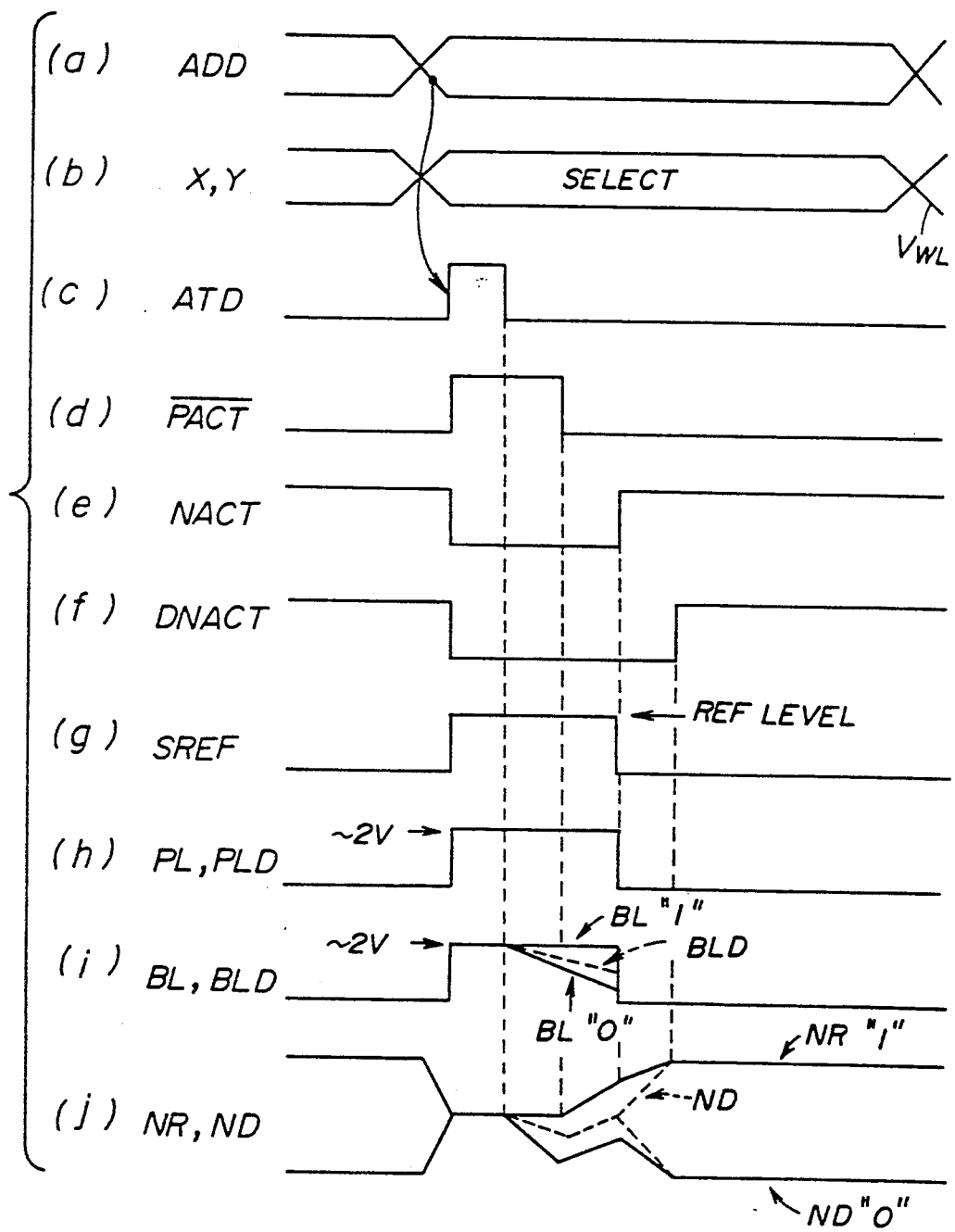
FIG. 10(a-j) a timing chart of signals at different parts of the memory cell array and the configuration shown 9.

An address buffer 41 receives an address ADD supplied from an external device (not shown) such as a central processing unit, and generates a detection signal $\overline{ATDa}$ when the received address ADD changes. A chip enable buffer 42 receives a chip enable signal $\overline{CE}$ which is a low-active signal, and outputs a low-active detection signal $\overline{ATDCE}$. An address transition detection signal generator 43 (hereinafter simply referred to as an ATD generator) receives the signals $\overline{ATDa}$ and $\overline{ATDCE}$, and generates an address transition detection signal (hereinafter simply referred to as an ATD signal (or signal ATD) as shown in (c) of FIG. 10. A sense amplifier controller 44 receives the ATD signal, and generates an n-channel active signal (hereinafter simply referred to as a NACT signal or signal NACT), a low-active p-channel active signal (hereinafter simply referred to as a $\overline{PACT}$ signal or signal $\overline{PACT}$), and a delayed n-channel active signal (hereinafter simply referred to as a DNACT signal or signal DNACT). As shown in (d) and (e) of FIG. 10, the NACT signal has a pulse wider than that of the $\overline{PACT}$ signal. As shown in (e) and (f) of FIG. 10, the DNACT signal has a pulse wider than that of the NACT signal. The leading edges of the signals $\overline{PACT}$, NACT and DNACT are synchronous with the leading edge of the ATD signal. A reference generator 45 receives the NACT signal, and generates a sense amplifier reference voltage signal (hereinafter simply referred to as an SREF signal or signal SREF), a program line signal corresponding to the aforementioned voltage $V_{CG}$ (hereinafter simply referred to as a PL signal or signal PL), and a program line dummy signal (hereinafter simply referred to as a PLD signal or signal PLD). The SREF signal is shown in (g) of FIG. 10, and the PL signal and PLD signal are shown in (h) of FIG. 10. The SREF signal has the same pulse width as the NACT signal, and has a reference level (3 volts for example) lower than the positive power source voltage $V_{DD}$ (5 volts for example). Each of the signals PL and PLD has the same pulse width and has a potential (about 2 volts for example) lower than the reference level of the SREF signal. As will be described, the potential of the PLD signal is set slightly lower than that of the PL signal. A detailed configuration of the reference generator 45 will be described later. A decoder 46 decodes the address ADD supplied from the address buffer 41, and generates a row address Xn (1−n) and a column address Ym (1−m).

Figure 11A:
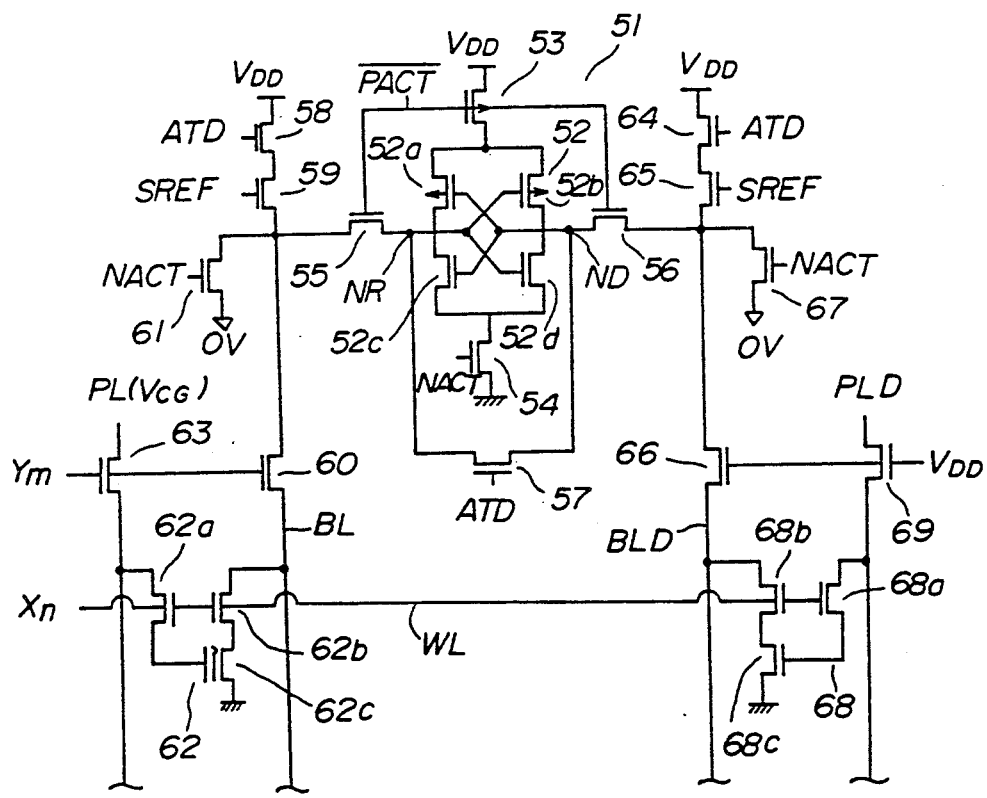
FIG. 11A is a circuit diagram of a memory cell and its peripheral circuit.

FIG. 11A illustrates a part of the EEPROM according to the embodiment of the present invention. The illustrated configuration includes a bit line BL to which a memory cell 62 is coupled, a dummy bit line BLD to which a reference (dummy) memory cell 68 is coupled, a word line WL to which the memory cell 62 and the dummy memory cell 68 are coupled, and a sense amplifier provided for the bit line BL and the dummy bit line BLD which are paired.

The memory cell 62 includes a drive transistor 62a of the enhancement type, a select transistor 62b and a memory transistor 62c having a floating gate, which correspond to the aforementioned transistors 31, 15 and 11, respectively. The reference (dummy) memory cell 68 includes a drive transistor 68a, a select transistor 68b and a memory transistor 68c which does not have a floating gate but a normal gate.

The sense amplifier 51 includes a flip-flop 52, which is made up of two p-channel MOS transistors 52a, 52b and two n-channel MOS transistors 52c and 52d. The state of the flip-flop 52 is based on the difference in potential between nodes NR and ND. The sources of the transistors 52a and 52b are coupled to the positive power source $V_{DD}$ through a p-channel MOS transistor 53, and the sources of the transistors 52c and 52d are coupled to the negative power source VSS (ground) through an n-channel MOS transistor 54. The gates of the transistors 53 and 54 are supplied with the signals $\overline{PACT}$ and NACT, respectively. The nodes NR and ND are coupled to the bit line BL and the dummy bit line BLD through n-channel MOS transistors 55 and 56, respectively. The gates of the transistors 55 and 56 are supplied with the $\overline{PACT}$ signal. An n-channel MOS transistor 57 is connected across the nodes NR and ND. The gate of the transistor 57 is supplied with the ATD signal.

The positive power source voltage $V_{DD}$ is applied to the bit line BL through three n-channel MOS transistors 58, 59 and 60 connected in series. Similarly, the positive power source voltage $V_{DD}$ is applied to the dummy bit line BLD through three n-channel MOS transistors 64, 65 and 66 connected in series. The transistors 60 and 66 form a column gate. The ATD signal is supplied to the gates of the transistors 58 and 64. The SREF signal is supplied to the gates of the transistors 59 and 65. The row address Xn is applied to the word line WL, and the column address Ym is applied to the gate of the transistor 60 through an n-channel MOS transistor 63 provided in the program line PL. The gate of the transistor 66 is supplied with the positive power source voltage $V_{DD}$ through an N-channel MOS transistor 69 provided in the dummy program line PLD. An n-channel MOS transistor 61 is provided between ground and the connection node of the transistors 55 and 59. Likewise, an n-channel MOS transistor 67 is provided between ground and the connection node of the transistors 57 and 67.

Figure 11B:
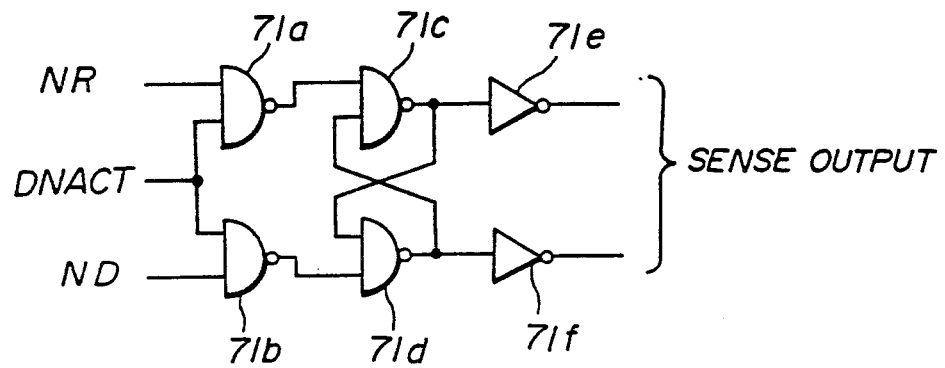
FIG. 11B is a circuit diagram of a circuit which outputs a sense output.

A circuit shown in FIG. 11B is connected across the nodes NR and ND. The circuit shown in FIG. 11B is made up of NAND gates 71a, 71b, 71c and 71d, and inverters 73e and 71f. The DNACT signal is applied to the NAND gates 71a and 71b, which are connected to the nodes NR and ND, respectively. A sense output is drawn from the inverters 71e and 71f.

Figure 11C:
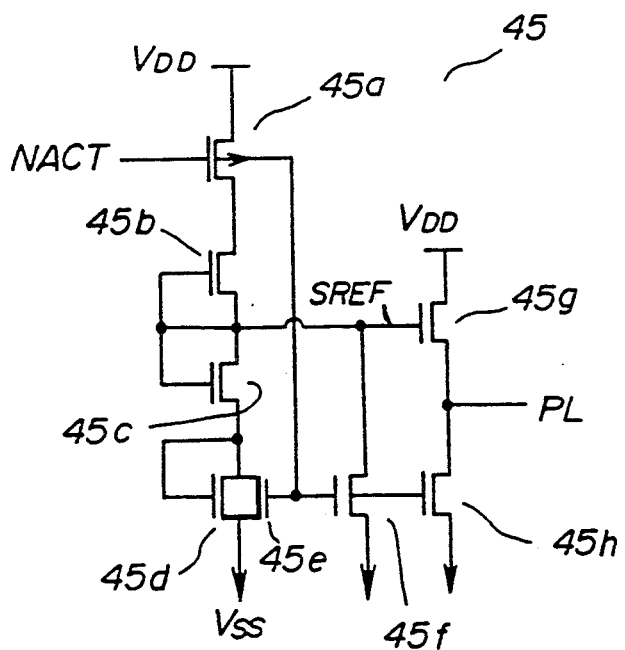
FIG. 11C is a circuit diagram of a reference generator shown in FIG. 9.

FIG. 11C is a circuit diagram of the reference generator 45 shown in FIG. 9. The reference generator 45 is made up of a p-channel MOS transistor 45a, and n-channel MOS transistors 45b–45h. The MOS transistor 45b is of the depletion type. The NACT signal is applied to the gates of the transistors 45a, 45e and 45f. The potential of the gate of the transistor 45g is equal to a potential obtained by subtracting the threshold voltages of the transistors 45a and 45b from the positive power source voltage $V_{DD}$. With $D_{DD}$ equal to 5 volts, the gate voltage of the transistor 45g is approximately 3 volts. This voltage forms the aforementioned SREF signal. The PL signal is drawn from the connection node of the transistors 45g and 45h. The potential of the PL signal corresponds to a potential obtained by subtracting the threshold voltage of the transistor 45g from the potential of the SREF siganl. With the SREF signal equal to 3 volts, the voltage of the PL signal is approximately 2 volts. The reference generator 45 further includes a circuit which is identical to that shown in FIG. 11C and generates the PLD signal. It is preferable that the voltage of the PLD signal, $V_{PLD}$ satisfy the following formula:

$$V_{PLD} \approx C_R V_{PL} \qquad (3)$$

where $V_{PL}$ is the potential of the program line PL and $C_R$ is a cell capacitance ratio.

In operation, when the address ADD changes (FIG. 10(a)), the ATD generator 43 shown in FIG. 9 generates the ATD signal (FIG. 10(c)). Assuming that the bit line BL and the word line WL shown in FIG. 11A are selected. In synchronism with the rise of the ATD signal, the signals $\overline{PACT}$ and SREF rise (FIG. 10(d), (g)), and the signals NACT and DNACT fall (FIG. 10(e), (f)). At this time, the transistors 58, 59 and 60 are turned ON so that the bit line BL is charged up. Similarly, the transistors 64, 65 and 66 are turned ON so that the dummy bit line BLD is charged up. Further, the program line PL and the dummy program line PLD are charged up. When the $\overline{PACT}$ rises, the flip-flop 52 is disconnected from the positive power source $F_{DD}$ and the negative power source $V_{SS}$ (ground). Further, the flip-flop 52 is connected to the bit line BL and the dummy bit line BLD, and the nodes NR and ND are short-circuited so that the potential of the node NR is set equal to that of the node ND. When the ATD signal falls, charging-up of the bit line BL and the program line PL is terminate.

Then a slight potential difference between the bit line BL and the dummy bit line BLD occurs (FIG. 10(i)). When the memory transistor 62c has data "1", the potential of the bit line BL is higher than that of the dummy bit line BLD. On the other hand, when the memory transistor 62c has data "0", the potential of the bit line BL is lower than that of the dummy bit line BLD. The potential difference between the bit line BL and the dummy bit line BLD gradually increases.

When the $\overline{PACT}$ signal falls, the flip-flop 52 is disconnected from the bit line BL and the dummy bit line BLD. The flip-flop 52 functions to amplify the potential difference between the bit line BL and the dummy bit line BLD (FIG. 10(j)). Then the NACT signal rises, and the signals SREF, PL and PLD fall. Thereby, the bit line BL and the dummy bit line BLD are discharged through the transistors 61 and 67, respectively, and the program line PL and the dummy program line PLD are set to zero volts. After that, the DNACT signal rises and the sense output drawn from the inverters 71e and 71f shown in FIG. 11B is settled (FIG. 10(j)). Then the voltage $V_{WL}$ of the word line WL is decreased to zero volts (FIG. 10(b)).

It is noted that at the time of data readout, the bit line BL and the program line PL (control gate of the transistor 62a) are set to zero volts before the word line WL is turned OFF. It is further noted that the potential of the bit line BL is set approximately equal to the potential of the program line PL (control gate). These timing arrangements are based on the employment of the enhancement type transistors which form the drive transistors of the memory cells.

The present invention is not limited to the aforementioned embodiments, and variations and modifications may be made without departing from the scope of the present invention.

What is claimed is:

1. An electrically erasable and programmable read only memory comprising:
   a memory cell array including a plurality of memory cells coupled to bit lines and word lines, each of said memory cells including a select transistor controlled by one of said word lines, a memory transistor having a drain region coupled to one of said bit lines through said select transistor and having a control gate, and a drive transistor of the enhancement type having a gate coupled to said one of the word lines and applying a control gate voltage supplied through a program line to said control gate of said memory transistor, and a drain voltage being supplied to said drain region of said memory transistor;

select means for selecting at least one of said bit lines and one of said word lines based on an address supplied from an external device wherein when said select means selects one of said word lines at the time of reading out data stored in the memory cells coupled to a selected word line, said drive transistor related to said selected word line is turned ON due to a level change of said selected word line so that said control gate voltage is applied to said control gates of said memory transistors through said turned-ON drive transistor and therein drives the corresponding memory transistors during reading, and the remaining memory transistors related to the non-selected word lines during reading are provided with no control gate voltage through the corresponding drive transistor held OFF, and wherein when said select means selects at least one of said bit lines, said drain voltage is applied to said drain regions of the memory transistors coupled to said at least one of said bit lines;

sense amplifier means for outputting data stored in said memory cell array; and discharging means for discharging said drain regions and control gates of said memory transistors after a predetermined time has passed from a transition of said address and application of said control gate voltage and for stopping discharging said drain regions and control gates of said memory transistors before a next transition of said address occurs.

2. An electrically erasable and programmable read only memory as claimed in claim 1, further comprising generating means for generating said control gate voltage in response to a transition of said address.

3. An electrically erasable and programmable read only memory as claimed in claim 2, wherein said generating means stops generating said control gate voltage before a next transition of said address occurs.

4. An electrically erasable and programmable read only memory as claimed in claim 2, wherein said control gate voltage is equal to said drain voltage.

5. An electrically erasable and programmable read only memory as claimed in claim 2, wherein said generating means drives said control gate voltage to a predetermined positive power source voltage in response to said transition of said address.

6. An electrically erasable and programmable read only memory as claimed in claim 1, further comprising a transistor provided for each of said bit lines, and said transistor has a gate and couples corresponding one of said bit lines to a power source, and voltage signal generating means for generating a voltage signal to be applied to said gate of the transistor, wherein the potential of each of said bit lines is based on said voltage signal applied to said transistor.

7. An electrically erasable and programmable read only memory as claimed in claim 6, wherein said voltage signal generating means generates said voltage signal in response to a transition of said address, and stops generating said voltage signal before a next transition of said address occurs.

8. An electrically erasable and programmable read only memory as claimed in claim 1, further comprising a transistor provided in said program line, wherein said transistor is turned ON when at least one of the bit lines is selected by said select means.

9. An electrically erasable and programmable read only memory as claimed in claim 1, wherein said memory cell array comprises a plurality of dummy memory cells coupled to said word lines and dummy bit line which correspond with said bit lines forming pairs.

10. An electrically erasable and programmable read only memory as claimed in claim 9, wherein said sense amplifier means includes means provided for each pair of said bit line and dummy bit line for sensing and amplifying a potential difference between said pair of the bit line and dummy bit line.

11. An electrically erasable and programmable read only memory as claimed in claim 1, wherein said memory cell array is divided into a plurality of blocks each including a predetermined number of said memory cells.

12. An electrically erasable and programmable read only memory as claimed in claim 11, wherein said select means selects one of said word lines and at least one of said bit lines having the same number as said memory cells contained in each of said blocks so that said memory cells are selected per block unit.

13. An electrically erasable and programmable read only memory comprising:

a memory cell array including a plurality of memory cells coupled to bit lines and word lines, each of said memory cells including a memory transistor having a drain region and a control gate, a control gate voltage being applied to said control gate of said memory transistor, and a drain voltage being supplied to said drain region of the memory transistor;

select means for selecting at least one of said bit lines and one of said word lines based on an address supplied from an external device, wherein when said select means selects one of said word lines at the time of reading out data stored in the memory cells coupled to said selected word line, said control gate voltage is applied to said control gates of said memory transistors so that the corresponding memory transistors are driven, and wherein when said select means selects at least one of said bit lines, said drain voltage is applied to said drain regions of the memory transistors coupled to said at least one of said bit lines;

sense amplifier means for outputting data stored in said memory cell array; and discharging means for discharging said drain regions and control gates of said memory transistors after a predetermined time has passed from a transition of said address and application of said control gate voltage and for stopping discharging said drain regions and control gates of said memory transistors before a next transition of said address occurs.

14. An electrically erasable and programmable read only memory comprising:

a memory cell array including a plurality of memory cells coupled to bit lines and word lines, each of said memory cells including a memory transistor having a drain region and a control gate, a control gate voltage being applied to said control gate of said memory transistor, and a drain voltage being supplied to said drain region of the memory transistor;

select means for selecting at least one of said bit lines and one of said word lines based on an address supplied from an external device;

sense amplifier means for outputting data stored in said memory cell array; and discharging means for discharging said drain regions and control gates of said memory transistors after a predetermined time has passed from a transition of said address and application of said control gate voltage and for stopping discharging said drain regions and control gates of said memory transistors before a next transition of said address occurs, wherein when said select means selects one of said word lines at the time of reading out data stored in the memory cells coupled to said selected word line, said control gate voltage is applied to said control gates of said memory transistors so that the corresponding memory transistors are driven, and when said select means selects at least one of said bit lines, said drain voltage is applied to said drain regions of the memory transistors coupled to said at least one of said bit lines and wherein said sense amplifier means includes flip-flop circuits, each having two input terminals, a plurality of dummy memory cells coupled to said word lines and dummy bit line which are paired with said at least one of said bit lines, one of said two input terminals being connected to a corresponding bit line, and the other of said two input terminals being connected to a corresponding dummy bit line, and means for sensing and amplifying a potential difference between said at least one of said bit lines and dummy bit lines which are paired.

* * * * *

UNITED STATES PATENT AND TRADEMARK OFFICE
CERTIFICATE OF CORRECTION

PATENT NO. : 5,138,575
DATED : August 11, 1992
INVENTOR(S) : EMA et al

It is certified that error appears in the above-identified patent and that said Letters Patent is hereby corrected as shown below:

On the title page, Item: [54], change the title of the Patent from "ELECTRICALY ERASABLE AND PROGRAMMABLE READ ONLY MEMORY WITH A DISCHARGE DEVICE" to --ELECTRICALLY ERASABLE AND PROGRAMMABLE READ ONLY MEMORY WITH A DISCHARGE DEVICE--.

Signed and Sealed this

Twenty-third Day of November, 1993

Attest:

BRUCE LEHMAN

Attesting Officer     Commissioner of Patents and Trademarks